(12) United States Patent
Ikeda et al.

(10) Patent No.: US 7,346,415 B2
(45) Date of Patent: Mar. 18, 2008

(54) SEMICONDUCTOR WAFER POSITIONING METHOD, AND APPARATUS USING THE SAME

(75) Inventors: Satoshi Ikeda, Mie-ken (JP); Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 148 days.

(21) Appl. No.: 11/296,276

(22) Filed: Dec. 8, 2005

(65) Prior Publication Data

US 2006/0194406 A1 Aug. 31, 2006

(30) Foreign Application Priority Data

Feb. 28, 2005 (JP) .............................. 2005-053541

(51) Int. Cl.
*G06F 19/00* (2006.01)
*H01L 21/68* (2006.01)

(52) U.S. Cl. .................. 700/114; 700/213; 438/401; 414/936

(58) Field of Classification Search ................ 700/114, 700/213; 438/401; 702/150; 414/936

See application file for complete search history.

(56) References Cited

U.S. PATENT DOCUMENTS 5,644,400 A * 7/1997 Mundt ........................ 356/400
5,822,213 A * 10/1998 Huynh ....................... 700/213

FOREIGN PATENT DOCUMENTS

JP 8-279547 10/1996
JP 2003-258062 * 9/2003

* cited by examiner

*Primary Examiner*—Leo Picard
*Assistant Examiner*—Steven R. Garland
(74) *Attorney, Agent, or Firm*—Cheng Law Group PLLC

(57) ABSTRACT

The intensity of light of a predetermined wavelength corresponding to the type of a protective tape joined to the surface of a semiconductor wafer is adjusted by a controller, and a holding stage for holding the semiconductor wafer is scanned rotationally. At this time, at a V notch portion for positioning formed in the semiconductor wafer, light is transmitted through the protective sheet covering the surface, which is received by a photoreception sensor. Based on the change in the reception amount of light in the photoreception sensor, the position of a detection site is specified.

14 Claims, 5 Drawing Sheets

SEMICONDUCTOR WAFER POSITIONING METHOD, AND APPARATUS USING THE SAME

BACKGROUND OF THE INVENTION (1) Field of the Invention

The present invention relates to a semiconductor wafer positioning method for determining a handling position of a semiconductor wafer having a detection site such as a V notch or an orientation flat at a peripheral edge thereof based on positional information of the detection site, and relates to an apparatus using the method.

(2) Description of the Related Art

A semiconductor wafer (hereinafter, simply referred to as a "wafer") is subjected to back surface processing performed by a mechanical method such as grinding or polishing, a chemical method using etching, or the like, so that the thickness thereof is reduced. When the wafer is processed by using such a method, a protective tape is joined to the wafer surface so as to protect the surface on which a wiring pattern has been formed. For the polished wafer on which the protective tape is joined, positional information of the peripheral edge is obtained in a process of being rotationally scanned in a state that the peripheral edge is interposed between a light source and a photoreception sensor. Based on the positional information, the center position of the wafer is obtained (see, for example, JP-A 08-279547 (1996)).

Further, at the same time as obtaining the center position of the wafer, positional information about the detection site such as a V notch or an orientation flat used for positioning is obtained, and based on the information, a handling position of the wafer is determined. That is, on the basis of the position of the detection site, a handling position is determined while considering a rotational direction about the wafer center axis when transported or joined and held from the wafer back surface to a ring frame via a supporting adhesive tape.

However, the conventional method involves the following problem.

Recently, a wafer is required to be thinner along with the rapid progress of application, so it is processed to be as thin as 150 µm or less. As a wafer becomes thinner, the rigidity of the wafer itself is reduced. Therefore, in order to make the wafer rigid, a protective tape made of a base material which is thick or hard material is joined to the wafer surface, for example. However, a protective tape joined so as to cover the whole surface of the wafer interrupts light transmitting a V notch portion for positioning formed in the peripheral edge of the substantially circular wafer. Therefore, the photoreception sensor cannot be received the projected light in the V notch portion Further, there are protective tapes in which surface processing and coloring are performed and the thickness is increased, whereby some types thereof are less likely to transmit light.

In such a case, a detection site in the peripheral edge of the wafer can be detected easily by an image processing system utilizing an optical system such as a camera. However, there is a problem that it is difficult to incorporate an image processing system in a conventional apparatus. Further, since an image processing system is expensive, there is caused a disadvantage that a burden of the installment cost is large.

SUMMARY OF THE INVENTION

The present invention has been made in view of aforementioned circumstances. It is therefore a main object of the present invention to provide a semiconductor wafer positioning method capable of obtaining, with high accuracy, the position of a detection site formed in a peripheral edge of a semiconductor wafer with an inexpensive configuration, and to provide an apparatus using the method.

In order to achieve the aforementioned object, the present invention adopts the following configuration.

A method for detecting a detection site for positioning provided in a peripheral edge of a substantially disc-shaped semiconductor wafer to which a protective sheet is joined, and determining a handling position of the semiconductor wafer with the use of the result of detection, the method comprising the steps of: projecting light of a predetermined wavelength corresponding to the protective sheet from light projecting means toward the semiconductor wafer to which the protective sheet is joined; adjusting an intensity of the light on a face projected to the semiconductor wafer; receiving the light, projected from the light projecting means toward the semiconductor wafer, by light receiving means disposed opposite the light projecting means with the semiconductor wafer interposed therebetween; determining a position of the detection site provided in the peripheral edge of the semiconductor wafer based on a change in a reception amount of light in the light receiving means; and positioning a handling position of the semiconductor wafer with the use of positional information of the detection site obtained from the result of determination in the determining step.

With this method according to the present invention, light of a predetermined wavelength corresponding to the protective sheet is projected toward a surface of a semiconductor wafer while a light intensity thereof is adjusted. The projected light is received by the light receiving means disposed opposite the light projecting means with the semiconductor wafer interposed therebetween. Then, based on the change in the reception amount of light in the light receiving means, the detection site provided in the peripheral edge of the semiconductor wafer is determined, and a handling position of the semiconductor wafer is obtained with the use of positional information of the detection site which is the result of determination.

Accordingly, it is possible to adjust, in accordance with the state of the protective sheet, the intensity of the light of a wavelength having transmittance corresponding to the type of the protective sheet. Therefore, the amount of light received by the light receiving means can be adjusted. In other words, it is possible to improve the light receiving accuracy by adjusting the reception amount of light in the light receiving means optionally. As a result, a handling position of the semiconductor wafer can be obtained with high accuracy with the use of the positional information of the detection site provided in the peripheral edge of the semiconductor wafer. Further, this method can be realized with an inexpensive configuration having light projecting means and light receiving means.

Preferably, the semiconductor wafer is held by holding means in a state where the peripheral edge thereof is exposed, and in the light receiving step, the light is projected from the light projecting means to the peripheral edge of the semiconductor wafer exposed from the holding means, and a set of light projecting means and light receiving means, disposed opposite the light projecting means, and the holding means are moved relatively in such a manner that the set of light projecting means and light receiving means scan rotationally along the peripheral edge of the semiconductor wafer exposed from the holding means. More preferably, a first rotational scan is performed in which the set of light projecting means and light receiving means are turned one round along the peripheral edge of the semiconductor wafer exposed from the holding means, in the determining step, the position of the detection site is determined temporarily based on the change in the amount of light received by the light receiving means in a rotational scanning process in the light receiving step, after the position of the detection site is determined temporarily in the determining step, the light receiving step is repeated, and in the light receiving step, during a period in which a second rotational scan is performed in which the set of light projecting means and light receiving means are turned one round along the peripheral edge of the semiconductor wafer exposed from the holding means, a rotational speed is made slow in a predetermined area including the detection site of the semiconductor wafer which has been determined temporarily in the determining step, and after the second rotational scan is completed, in the determining step, an optimum position of the detection site is determined from the predetermined area including the detection site determined temporarily, based on the change in the amount of light received by the light receiving means.

With this method, the position of the detection site can be determined with higher accuracy, so that a handling position of the semiconductor wafer can be calculated with high accuracy.

Note that in the light intensity adjusting step, the light intensity can be adjusted as follows.

For example, preferably, a light emission intensity of the light projecting means is adjusted in accordance with a thickness of the protective sheet in such a manner that the reception amount of light in the light receiving means at the detection site becomes a predetermined amount in the light receiving step. In this case, if the protective sheet is thick so that the light is less likely to be transmitted, the light emission intensity of the light projecting means is raised so as to increase the light transmitting amount of the protective sheet. As a result, the light receiving means can receive the transmitted light of the predetermined amount, so that the position of the detection site of the semiconductor wafer can be obtained with high accuracy.

Preferably, a distance from the light projecting means to the semiconductor wafer is adjusted in a state where a light emission intensity of the light projecting means is kept constant in accordance with the thickness of the protective sheet in such a manner that the reception amount of light in the light receiving means at the detection site becomes a predetermined amount in the light receiving step. In this case, if the protective sheet is thick so that the light is less likely to be transmitted, the light intensity on a face of the semiconductor wafer can be increased by decreasing the distance between the light projecting means and the semiconductor wafer even though the light emission intensity of the light projecting means is kept constant. That is, the light receiving means can receive the transmitted light of the predetermined amount, so that the position of the detection site of the semiconductor wafer can be obtained with high accuracy.

Preferably, a distance from the light projecting means to the light receiving means is adjusted in a state where a light emission intensity of the light projecting means is kept constant in such a manner that the reception amount of light in the light receiving means at the detection site becomes a predetermined amount in the light receiving step. In this case, if the protective sheet is thick so that the light is less likely to be transmitted, the light intensity on a face of the semiconductor wafer can be increased by decreasing the distance between the light projecting means and the light receiving means even though the light emission intensity of the light projecting means is kept constant. That is, the light receiving means can receive the transmitted light of the predetermined amount, so that the position of the detection site of the semiconductor wafer can be obtained with high accuracy.

Preferably, in the light projecting step, the light projecting means is adjusted so as to project light of a wavelength corresponding to a color of the protective sheet joined to the semiconductor wafer.

With this method, it is possible to project light of a wavelength having high transmittance corresponding to the color of the protective sheet. That is, light can be transmitted through the protective sheet irrespective of the color of the protective sheet; therefore, the transmitted light from the protective sheet covering the detection site in the peripheral edge of the semiconductor wafer can be received by the light receiving means with high accuracy.

An example of the detection site is a V notch formed in the peripheral edge of the semiconductor wafer.

In order to achieve the aforementioned object, the present invention also adopts the following configuration.

An apparatus for determining a handling position of a semiconductor wafer to which a protective sheet is joined, the apparatus comprising: holding means for holding the semiconductor wafer to which the protective sheet is joined; light projecting means for projecting light of a predetermined wavelength corresponding to the protective sheet toward a face of the semiconductor wafer held by the holding means; light intensity adjusting means for adjusting an intensity of the light on the face of the semiconductor wafer; light receiving means, disposed opposite the light projecting means with the semiconductor wafer interposed therebetween, for receiving the light projected from the light projecting means; moving means for moving a set of light projecting means and light receiving means and the holding means relatively; determining means for determining a position of a detection site for positioning formed in the peripheral edge of the semiconductor wafer, based on a change in an amount of light received by the light receiving means during a period in which the moving means moves the set of light projecting means and light receiving means and the holding means relatively; computing means for obtaining a handling position of the semiconductor wafer with the use of positional information of the detection site obtained from the result of determination by the determining means; and rotation driving means for rotating the holding means in accordance with the result of computation by the computing means.

With this apparatus according to the present invention, the intensity of light of a predetermined wavelength corresponding to the type of the protective sheet projected on a face of the semiconductor wafer can be adjusted. That is, the intensity of light projected on a face of the semiconductor wafer can be increased; therefore, the reception amount of transmitted light in the light receiving means can be kept constant irrespective of the type of the protective sheet. In other words, the light receiving means can receive light transmitted through the protective tape at the detection site in the peripheral edge of the semiconductor wafer, whereby the detection site can be obtained with high accuracy.

Preferably, the light intensity adjusting means is voltage controlling means for controlling supply voltage of the light projecting means in accordance with a thickness of the protective sheet.

With this configuration, if the protective sheet is thick so that the light is less likely to be transmitted, the supply voltage to the light projecting means is increased so as to raise the light emission intensity to thereby increase the light transmission amount of the protective sheet. As a result, the light receiving means can receive the transmitted light of the predetermined amount, so that the position of a detection site in the peripheral edge of the semiconductor wafer can be obtained with high accuracy.

Examples of the light intensity adjusting means includes first driving means for driving the light projecting means upward/downward, and second driving means for driving the holding means upward/downward.

With this configuration, it is possible to change the distance between the light projecting means and the protective sheet or the distance between the light projecting means and the light receiving means. That is, by decreasing the distance between the light projecting means and the semiconductor wafer, the intensity of the light projected to the protective sheet can be raised; therefore, it is possible to increase the light transmission amount of the protective sheet and also to increase the reception amount of transmitted light in the light receiving means. As a result, the position of the detection site in the peripheral edge of the semiconductor wafer can be obtained with high accuracy.

Preferably, the light projecting means is configured to be capable of projecting light of a wavelength having transmittance corresponding to a color of the protective sheet.

With this configuration, light can be transmitted through the protective sheet irrespective of the color of the protective sheet. Therefore, it is possible to receive, by the light receiving means, the transmitted light from the protective sheet covering the detection site in the peripheral edge of the semiconductor wafer with high accuracy.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, an embodiment of a semiconductor wafer positioning apparatus according to the present invention will be explained with reference to the drawings.

Figure 1:
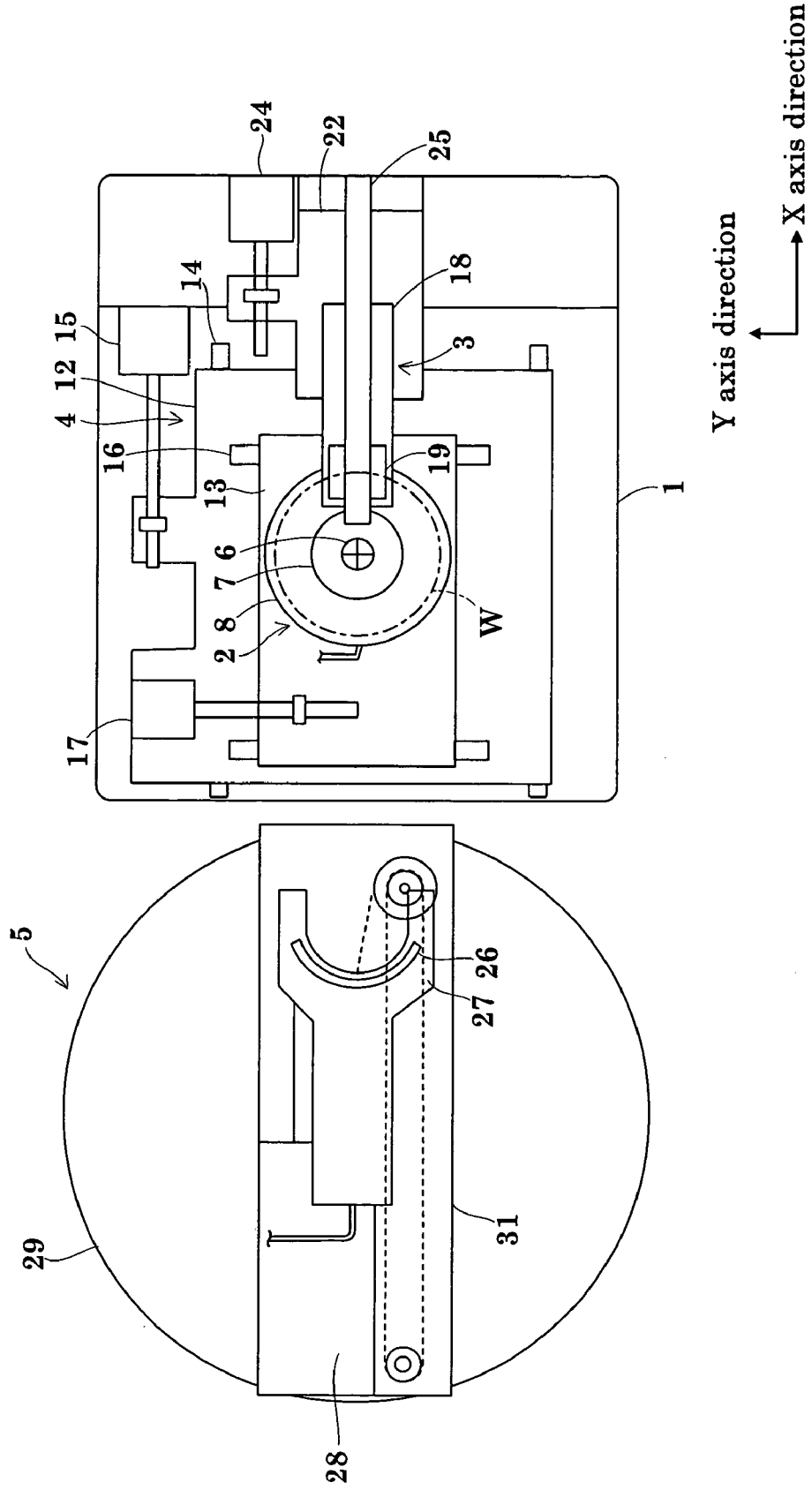
FIG. 1 is a front view showing the schematic overall configuration of a semiconductor wafer positioning apparatus according to an embodiment of the present invention.
Figure 2:
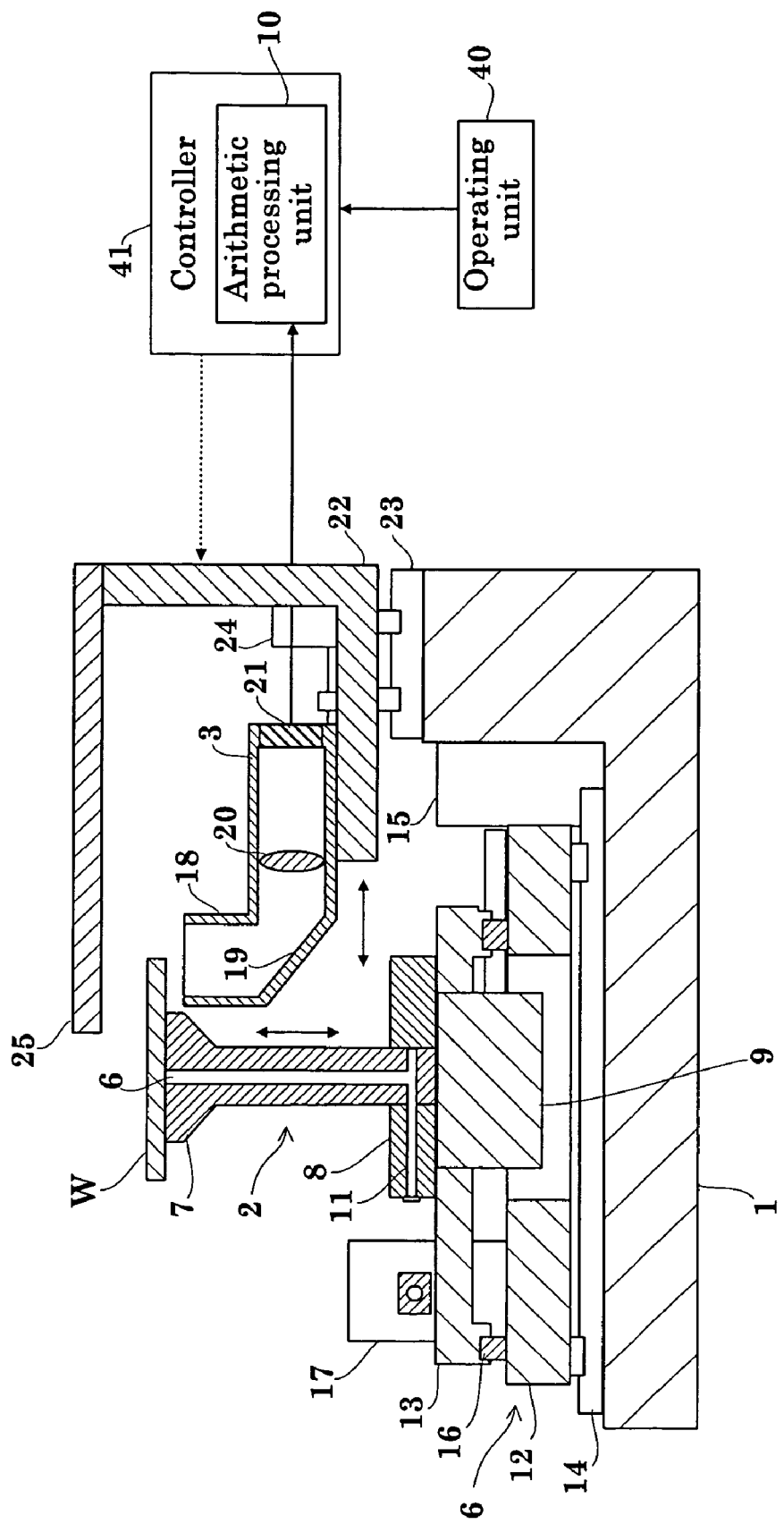
FIG. 2 is a front view showing the configuration of a main part of the positioning apparatus.

FIG. 1 is a plan view showing a semiconductor wafer positioning apparatus according to an embodiment of the present invention, and FIG. 2 is a front view showing the main part of the configuration of the semiconductor wafer positioning apparatus.

As shown in FIG. 1, an apparatus for determining the center of a semiconductor wafer of the present invention includes: a rotating mechanism 2 for holding and rotating a semiconductor wafer (hereinafter, simply referred to as a "wafer") W; a peripheral edge measuring mechanism 3 for measuring the peripheral edge of the wafer W held by the rotating mechanism 2; an arithmetic processing unit (not shown) for collecting an rotational angle of the rotating mechanism 2 and positional data of the peripheral edge of the wafer W relative to the rotational angle, and performing a predetermined arithmetic process; an ascent/descent driving mechanism 4 for enabling the rotating mechanism to move upward/downward with respect to the rotational axis; and a transporting mechanism 5 for transporting the wafer W to/from the rotating mechanism 2.

Note that the rotating mechanism 2 corresponds to moving means of the present invention and the ascent/descent driving mechanism 4 corresponds to second driving means of the present invention, respectively.

As shown in FIGS. 1 and 2, the rotating mechanism 2 includes a cylindrical holding stage 7 in which the back surface of the wafer is sucked by a suction hole 6 formed in the upper face thereof, and a stage receiving unit 8 for holding the holding stage 7 rotatably. Note that the holding stage 7 corresponds to holding means of the present invention.

Under the holding stage 7, a pulse motor 9 for rotation is provided continuously. The rotating mechanism 2 is rotatable with a drive of the pulse motor 9 for rotation. The pulse motor 9 for rotation is fixed to the ascent/descent driving mechanism 4. Further, for each certain rotational angle, the pulse of digital signals is transmitted from the pulse motor 9 for rotation to an arithmetic processing unit 10 described later. A certain rotational angle may be 0.036°, for example, and with one rotation of the rotating mechanism 2, a digital signal of 1000 pulses is transmitted to the arithmetic processing unit 10 provided in a controller 41. Further, the suction hole 6 is communicated with a suction device (not shown) via a hole 11 in the stage receiving unit 8. That is, a suction force for sucking the wafer W is given from the suction device to the suction hole 6.

The ascent/descent driving mechanism 4 includes an X-axis stage 12 capable of sliding in an X axial direction, and a Y-axis stage 13 capable of moving in a Y axial direction, shown in the figure. The X-axis stage 12 is mounted on an X-axis linear guide 14 laid on a base 1 of the apparatus so as to be reciprocally movable along the X axial direction with a drive of an X-axis pulse motor 15 fixed to the base 1.

Further, the Y-axis stage 13 is mounted on a Y-axis linear guide 16 laid on the X-axis stage 12 so as to be reciprocally movable along the Y axial direction with a drive of a Y-axis pulse motor 17 fixed to the X-axis stage 12. To the Y-axis stage 13, the stage receiving unit 8 and the pulse motor 9 for rotation are fixed.

The peripheral edge measuring mechanism 3 is provided on a side of the holding stage 7. Further, the peripheral edge measuring mechanism 3 includes a substantially L-shaped cylinder 18, a mirror 19 interposed in the cylinder 18, a lens 20, and a photoreception sensor 21. Note that the photoreception sensor 21 corresponds to light receiving means of the present invention.

The mirror 19 is disposed inside a substantially L-shaped bent part of the cylinder 18. That is, in order to reflect light made incident from the upper opening of the cylinder 20 toward the photoreception sensor 21 on the right side in the figure, the mirror 19 is disposed fixedly at an oblique angle of 45°, viewed from the front in the figure.

The photoreception sensor 21 is fixed to an end part in a longitudinal direction of the cylinder 18 which is on a side of the mirror 19. Further, the lens 20 is disposed fixedly between the mirror 19 and the photoreception sensor 21 in the cylinder 20 such that the reflected light from the mirror 19 is condensed on the photoreception sensor 21. Note that the photoreception sensor 21 is a one-dimensional line sensor in which a plurality of photoreception elements are arranged linearly, and transmits photoreception data received from the line sensor to the arithmetic processing unit 10 described later.

The peripheral edge measuring mechanism 3 is fixed to a stage 22 for measurement which is movable in a radial direction of the rotating mechanism 2 shown by an arrow in a horizontal direction in FIG. 2. The stage 22 for measurement is mounted on a linear guide 23 for measurement laid on the base 1. That is, the peripheral edge measuring mechanism 3 is configured such that the stage 22 for measurement moves in a radial direction of the rotating mechanism 2 with a drive of the pulse motor 24 for measurement. Further, on the stage 22 for measurement, there is disposed a light source 25 for projecting light toward the peripheral edge of the wafer W.

The light source 25 is provided above the peripheral edge of the wafer W and the mirror 19 so as to detect the position of the wafer W easily, and projects light toward the peripheral edge of the wafer W. That is, in order to realize the predetermined wavelength and light intensity in accordance with the type of a protective tape joined to the surface of the wafer W, various conditions such as wavelength band and voltage of the light source 25 are inputted from an operating unit 40 to the controller 41. Based on the inputted conditions, the controller 41 controls the voltage and the wavelength band of the light source 25. In the case of this embodiment, a fluorescence tube outputting while light of a wavelength of 300 to 800 nm is used. Note that the light source 25 corresponds to light projecting means of the present invention and the controller 41 corresponds to voltage controlling means of the present invention, respectively.

Note that types of protective tapes include quality of the base material, color, surface processed state of the base material, and thickness of the protective tape.

Figure 4:
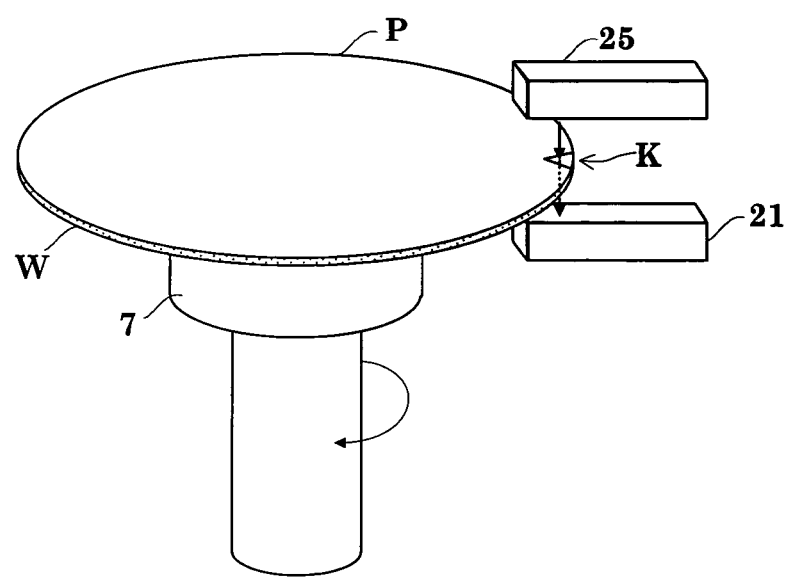
FIG. 4 is a perspective view around a rotation mechanism.
Figure 5:
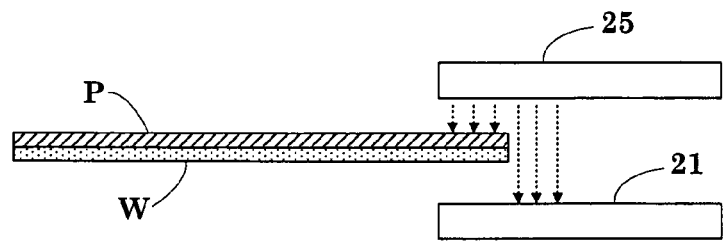
FIG. 5 is a diagram for explaining operation of the apparatus of the embodiment.
Figure 6:
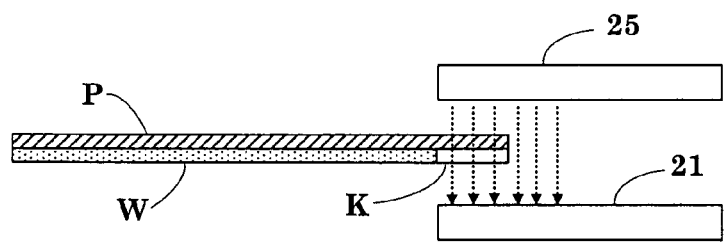
FIG. 6 is a diagram for explaining operation of the apparatus of the embodiment.

The arithmetic processing unit 10 calculates the center position of the wafer W and obtains the position of a V notch formed in the peripheral edge of the wafer. As shown in FIGS. 4 to 6, the center position of the wafer is calculated in such a manner that positional information of the peripheral edge of the wafer is first obtained by using photoreception voltage when light projected from the light source 25 to the peripheral edge of the wafer, while rotating the holding stage 7, is received by the photoreception sensor 21 linearly. Then, a distance from a point on the face of the wafer W to the peripheral edge is calculated, and the center position is determined by calculating dispersion of the distance data in a predetermined proportion from the large value, among pieces of obtained distance data. Note that determination of the center position of the wafer W is not limited to this calculation method, and may be obtained by using a least-square method.

Figure 7:
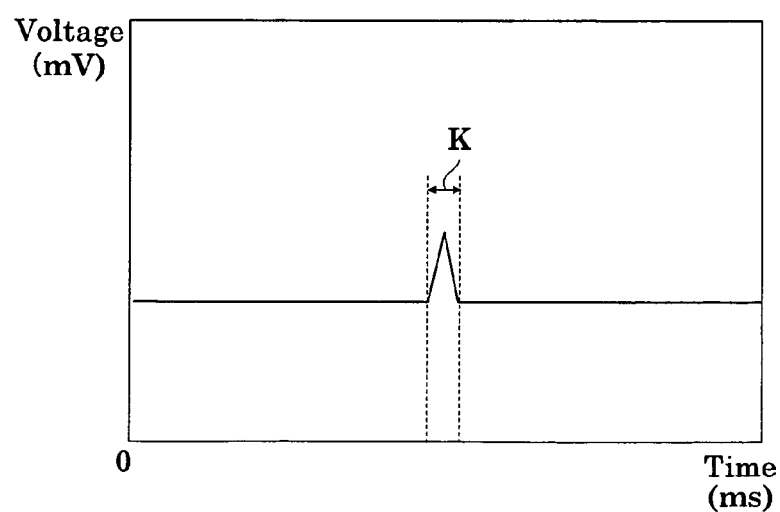
FIG. 7 is a chart showing the scan result of an peripheral edge of a wafer.

Further, the arithmetic processing unit 10 determines the position of the V notch based on the amount of change in the photoreception voltage from the photoreception sensor 21. For example, as shown in FIG. 7, data in which the photoreception voltage changes temporally is obtained from the photoreception sensor 21 with one rotational scan of the wafer W, as shown in FIG. 4. That is, if the wafer peripheral edge is a continuing arc, for the photoreception sensor 21, light is interrupted by the wafer W as shown in FIG. 5. Therefore, the photoreception voltage becomes low and constant as shown in FIG. 7. However, as shown in FIG. 6, for the portion of the V notch K, and the protective tape P is exposed from the wafer W, so the light is transmitted. Therefore, the transmitted light is received by the photoreception sensor 21. Accordingly, the photoreception voltage increases temporarily like a range shown by broken lines in FIG. 7. A portion consisting of the peak value of the photoreception voltage and portions before and after thereof not less than a predetermined voltage is determined as the V notch K.

Further, when the position of the V notch K is determined, the arithmetic processing unit 10 performs the next processing. When the wafer W is taken out and transported, in the next process, a position when it is mounted on the ring frame (reference position) is considered for example, and the shifted amount between the detection position and the reference position of the V notch is calculated. Note that the arithmetic processing unit 10 serves as determining means and calculating means of the present invention.

Figure 3:
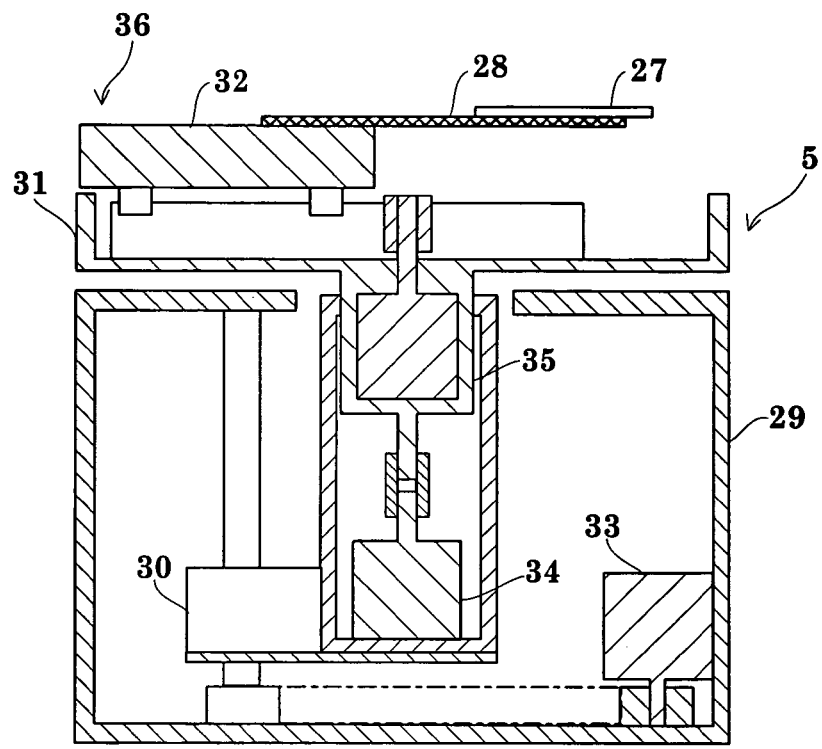
FIG. 3 is a sectional view showing the configuration of a main part of a transportation mechanism.

As shown in FIGS. 1 and 3, the transporting mechanism 5 includes a horseshoe-shaped robot arm 27 having a suction groove 26 for sucking and holding, at the time of transporting the wafer, the surface of the protective tape joined to the surface on which a pattern is formed of the wafer W, and an arm moving table 28 capable of moving the robot arm 27 freely in vertical and horizontal directions.

The arm moving table 28 includes a Z-axis stage 30 mounted movably in a vertical direction to a transporter base 29, a θ-axis stage 31 mounted rotatably to the Z-axis stage 30, and an R-axis stage 32 mounted to the θ-axis stage 31 so as to advance freely in a radial direction of the θ-axis stage 31. Here, the Z-axis stage 30, the θ-axis stage 31 and the R-axis stage 32 are provided movably or rotatably with a drive of each of a Z-axis pulse motor 33 mounted fixedly to the transporter base 29, a θ-axis pulse motor 34 mounted fixedly to the Z-axis stage 30, and an R-axis pulse motor 35 mounted fixedly to the θ-axis stage 31, respectively.

All pulse motors described above are connected to the controller 41 so as to control rotation or movement of the holding stage 7, the X-axis stage 12, the Y-axis stage 13, the stage 22 for measurement and the robot arm 27. Further, the controller 41 includes the arithmetic processing unit 10, and is connected to the arithmetic processing unit 10 so as to control each pulse motor based on the result of calculation by the photoreception sensor.

Figure 8:
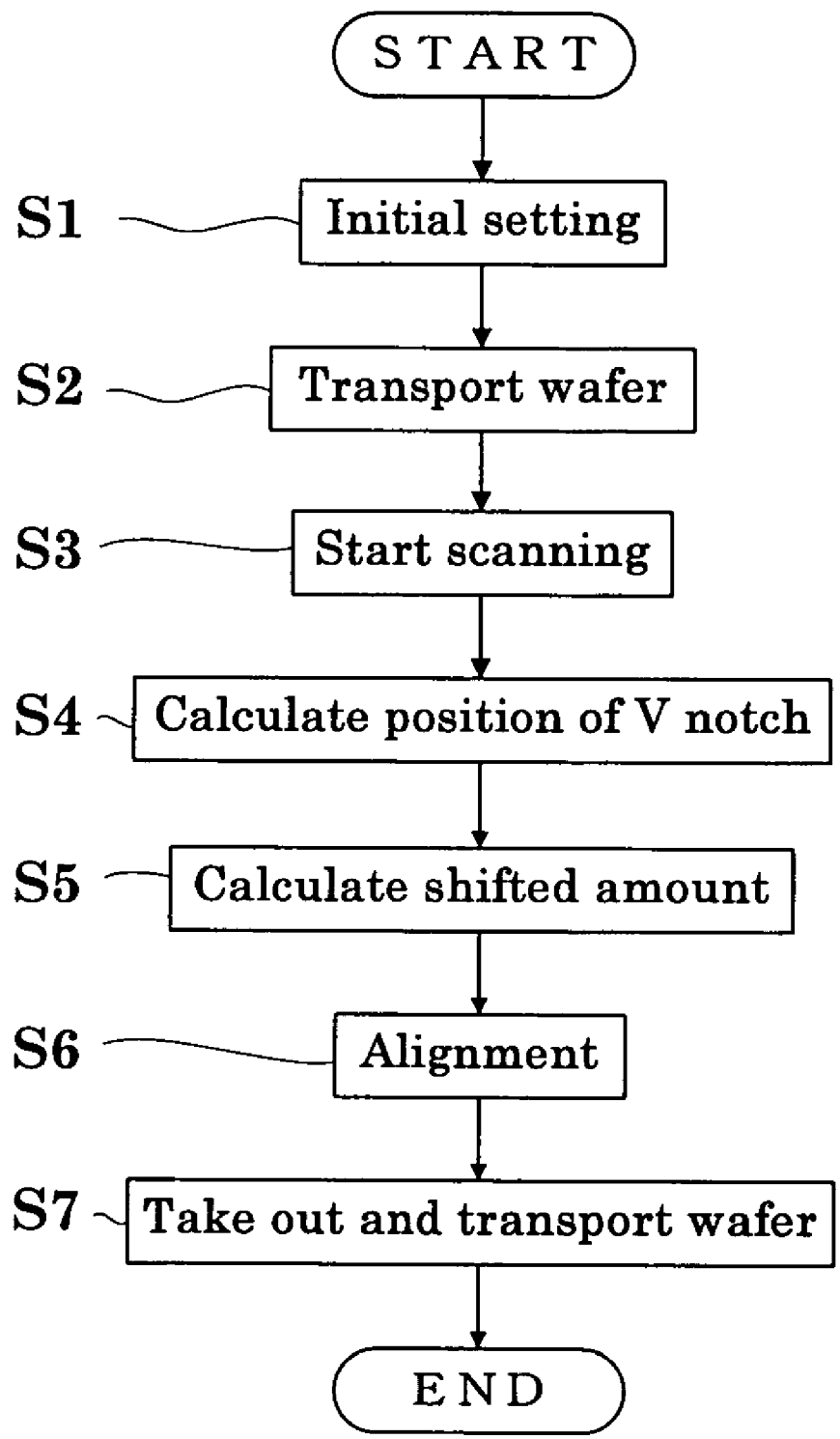
FIG. 8 is a flowchart showing processing of the apparatus of the embodiment.

Next, a set of operations for adjusting a handling position of the wafer W with the use of the apparatus of the aforementioned embodiment will be explained based on a flowchart shown in FIG. 8.

First, initial conditions required for positioning the wafer W is set to the controller 41 by operating the operating unit

40. As for the initial conditions, a diameter of the wafer W, a quality of the base material of the protective tape, a total thickness of the protective tape, and a color of the base material are set, for example. When the initial setting is completed, each pulse motor is driven, and each of the rotational mechanism 3, the peripheral edge measuring mechanism 4 and the ascent/descent driving mechanism operates, whereby the scan starting position is adjusted (step S1).

When the adjustment of the scan position is completed, the wafer W, accommodated in a horizontal state in multi-stage with certain intervals in a cassette (not shown), is taken out by the robot arm 27 provided to the transporting mechanism 5 which sucks and holds the wafer W from the back surface thereof, and is mounted on the holding stage 7 of the semiconductor wafer positioning apparatus (step S2).

When the wafer W is mounted on the holding stage 7, the wafer W is rotationally scanned for once about the center axis of the holding stage 7 in a state of being sucked and held. With the rotational scan, light is projected from the light source 25 to the peripheral edge of the wafer W, whereby data of the photoreception voltage is transmitted linearly from the photoreception sensor 21 to the arithmetic processing unit 10 (step S3).

When the rotational scan is completed, the arithmetic processing unit 10 calculates the center position of the wafer W with the use of the obtained photoreception voltage, and calculates the position of the V notch K based on the amount of change in the photoreception voltage (step S4).

Further, the arithmetic processing unit 10 calculates the shifted amount between the reference position of the V notch and the detection result of the V notch, and the shifted amount of the center position at the time of taking out and transporting the wafer W by the robot arm 25 (step S5).

Based on the obtained shifted amount of the center position of the wafer W, the controller 41 drive-controls the X-axis pulse motor 15 and the Y-axis pulse motor 16 to thereby move each of the X-axis stage 12 and the Y-axis stage 13 so as to align the center position of the wafer W. At the same time, the controller 41 rotation-controls the holding stage 7 so as to align the V notch K with the reference position (step S6).

When the alignment is completed, the wafer W is sucked and held by the robot arm 27 so as to be transported from the holding stage 7 to a storage cassette (not shown) (step S7). This is the end of the set of operations.

As described above, according to the position of the semiconductor wafer of the present invention, in accordance with the conditions, such as quality of the base material, total thickness of the protective tape and color, which differ depending on types of protective tapes, the intensity of light to be projected from the light source 25 to the protective tape joined to the surface of the wafer W is adjusted, whereby the amount of light transmitted through the protective sheet covering the V notch portion corresponding to the detection site in the peripheral edge of the wafer can be adjusted. In other words, it is possible to project light from the light source 25 in which the transmitted light at the V notch portion is receivable sufficiently in the photoreception sensor 21, so it is possible to obtain the position of the V notch with high accuracy. Further, it is possible to realize an apparatus having high accuracy in positioning with a simple configuration using the light source 25 and the photoreception sensor 21.

The present invention is not limited to the aforementioned embodiment, and may be carried out in modifications as follows.

(1) In the aforementioned embodiment, white light is projected from a fluorescence tube to a transparent protective tape. However, when the base material of the protective tape is colored, a wavelength corresponding to the color may be projected to the protective tape. In such a case, an RGB-LED consisting of light emitting diodes capable of outputting three primary colors of light, that is, red, blue and green, may be used as a light source, and the apparatus is configured so as to change the wavelength corresponding to the color of the base material of the protective sheet. For example, if the base material is red, the light emitting intensity of the red LED may be increased, and if the base material is transparent, output of the three colors may be increased simultaneously so as to increase the light emitting intensity of white. With such a configuration, it is possible to transmit light through the protective tape, irrespective of the color of the base material of the protective tape and the thickness of the protective tape. That is, the apparatus has the same effect as that of the aforementioned embodiment.

(2) In the aforementioned embodiment, a voltage control of the light source 25 is performed so as to increase the intensity of light projected to the protective sheet. However, the apparatus may be so configured that the light emitting intensity of the light source 25 is set constant, and the distance between the light source 25 and the holding stage 7 is adjusted, for example. In such a case, at least one of the holding stage 7 and the light source 25 may be moved upward/downward. Further, the distance between the light source 25 and the photoreception sensor 21 may be adjusted. With such a configuration, it is possible to increase the light intensity on the face projected to the protective tape, so the light transmittance with respect to the protective sheet increases, whereby the photoreception sensor 21 can receive transmitted light with high accuracy. That is, the apparatus has the same effect as that of the aforementioned embodiment.

(3) In the aforementioned embodiment, the center of the wafer W and the position of the V notch are obtained by using photoreception voltage acquired through one scanning. However, the position of the V notch may be obtained by performing scanning twice. In such a case, in the first scanning the center position of the wafer W is obtained, and a portion in which the photoreception voltage is high is determined temporarily as the V notch. In the second scanning, only the portion which is determined temporarily as the V notch or a portion including the before and after of the part is scanned at a speed slower than the scanning speed of the first time. In this way, by obtaining only the photoreception voltage of the V notch portion, it is possible to obtain the center of the V notch with high accuracy, whereby it is possible to determine the handling position with high accuracy.

(4) Although a protective tape is used in the aforementioned embodiment, the present invention may be applied to a transparent substrate such as glass.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for detecting a detection site for positioning provided in a peripheral edge of a substantially disc-shaped semiconductor wafer to which a protective sheet is joined, and determining a handling position of the semiconductor wafer, the method comprising the steps of:
   projecting light of a predetermined wavelength corresponding to the protective sheet from light projecting means toward the semiconductor wafer to which the protective sheet is joined;
   adjusting an intensity of the light projecting toward the semiconductor wafer;
   receiving the light, projected from the light projecting means toward the semiconductor wafer, by light receiving means disposed opposite the light projecting means with the semiconductor wafer interposed therebetween;
   determining a position of the detection site provided in the peripheral edge of the semiconductor wafer based on a change in a reception amount of light in the light receiving means; and
   positioning a handling position of the semiconductor wafer with the use of positional information of the detection site obtained from the result of determination in the determining step.

2. The method of claim 1, wherein
   the semiconductor wafer is held by holding means in a state where the peripheral edge thereof is exposed, and
   in the light receiving step, the light is projected from the light projecting means to the peripheral edge of the semiconductor wafer exposed from the holding means, and the light projecting means, the light receiving means, disposed opposite the light projecting means, and the holding means are moved relatively in such a manner that the light projecting means and light receiving means scan rotationally along the peripheral edge of the semiconductor wafer exposed from the holding means.

3. The method of claim 1, wherein
   in the light intensity adjusting step, a light emission intensity of the light projecting means is adjusted in accordance with a thickness of the protective sheet in such a manner that the reception amount of light in the light receiving means at the detection site becomes a predetermined amount in the light receiving step.

4. The method of claim 1, wherein
   in the light intensity adjusting step, a distance from the light projecting means to the semiconductor wafer is adjusted in a state where a light emission intensity of the light projecting means is kept constant in accordance with the thickness of the protective sheet in such a manner that the reception amount of light in the light receiving means at the detection site becomes a predetermined amount in the light receiving step.

5. The method of claim 1, wherein
   in the light intensity adjusting step, a distance from the light projecting means to the light receiving means is adjusted in a state where a light emission intensity of the light projecting means is kept constant in such a manner that the reception amount of light in the light receiving means at the detection site becomes a predetermined amount in the light receiving step.

6. The method of claim 1, wherein
   in the light projecting step, the light projecting means is adjusted so as to project light of a wavelength corresponding to a color of the protective sheet joined to the semiconductor wafer.

7. The method of claim 1, wherein
   the detection site is a V notch formed in the peripheral edge of the semiconductor wafer.

8. A method for detecting a detection site for positioning provided in a peripheral edge of a substantially disc-shaped semiconductor wafer to which a protective sheet is joined, and determining a handling position of the semiconductor wafer, the method comprising the steps of:
   protecting light of a predetermined wavelength corresponding to the protective sheet from light projecting means toward the semiconductor wafer to which the protective sheet is joined;
   adjusting an intensity of the light projecting toward the semiconductor wafer;
   receiving the light, projected from the light protecting means toward the semiconductor wafer, by light receiving means disposed opposite the light protecting means with the semiconductor wafer interposed therebetween;
   determining a position of the detection site provided in the peripheral edge of the semiconductor wafer based on a chance in a reception amount of light in the light receiving means; and
   positioning a handling position of the semiconductor wafer with the use of positional information of the detection site obtained from the result of determination in the determining step,
   wherein in the light receiving step, a first rotational scan is performed in which the light projecting means and light receiving means are turned one round along the peripheral edge of the semiconductor wafer exposed from a holding means,
   in the determining step, the position of the detection site is determined temporarily based on the change in the amount of light received by the light receiving means in a rotational scanning process in the light receiving step,
   after the position of the detection site is determined temporarily in the determining step, the light receiving step is repeated, and in the light receiving step, during a period in which a second rotational scan is performed in which the light projecting means and light receiving means are turned one round along the peripheral edge of the semiconductor wafer exposed from the holding means, a rotational speed is made slow in a predetermined area including the detection site of the semiconductor wafer which has been determined temporarily in the determining step, and
   after the second rotational scan is completed, in the determining step, an optimum position of the detection site is determined from the predetermined area including the detection site determined temporarily, based on the change in the amount of light received by the light receiving means.

9. An apparatus for determining a handling position of a semiconductor wafer to which a protective sheet is joined, the apparatus comprising:
   holding means for holding the semiconductor wafer to which the protective sheet is joined;
   light projecting means for projecting light of a predetermined wavelength corresponding to the protective sheet toward a face of the semiconductor wafer held by the holding means;
   light intensity adjusting means for adjusting an intensity of the light on the face of the semiconductor wafer;

light receiving means, disposed opposite the light projecting means with the semiconductor wafer interposed therebetween, for receiving the light projected from the light projecting means;
moving means for moving the light projecting means and light receiving means and the holding means relatively;
determining means for determining a position of a detection site for positioning formed in the peripheral edge of the semiconductor wafer, based on a change in an amount of light received by the light receiving means during a period in which the moving means moves the light projecting means and light receiving means and the holding means relatively;
computing means for obtaining a handling position of the semiconductor wafer with the use of positional information of the detection site obtained from the result of determination by the determining means; and
rotation driving means for rotating the holding means in accordance with the result of computation by the computing means.

10. The apparatus of claim 9, wherein
the light projecting means is configured to be capable of projecting light of a wavelength having transmittance corresponding to a color of the protective sheet.

11. The apparatus of claim 9, wherein
the detection site is a V notch formed in the peripheral edge of the semiconductor wafer.

12. An apparatus for determining a handling position of a semiconductor wafer to which a protective sheet is joined, the apparatus comprising:
holding means for holding the semiconductor wafer to which the protective sheet is joined;
light projecting means for protecting light of a predetermined wavelength corresponding to the protective sheet toward a face of the semiconductor wafer held by the holding means;
light intensity adjusting means for adjusting an intensity of the light on the face of the semiconductor wafer;
light receiving means, disposed opposite the light projecting means with the semiconductor wafer interposed therebetween, for receiving the light projected from the light projecting means;
moving means for moving the light projecting means and light receiving means and the holding means relatively;
determining means for determining a position of a detection site for positioning formed in the peripheral edge of the semiconductor wafer, based on a change in an amount of light received by the light receiving means during a period in which the moving means moves the light projecting means and light receiving means and the holding means relatively;
computing means for obtaining a handling position of the semiconductor wafer with the use of positional information of the detection site obtained from the result of determination by the determining means; and
rotation driving means for rotating the holding means in accordance with the result of computation by the computing means,
wherein the light intensity adjusting means is second driving means for controlling supply voltage of the light projecting means in accordance with a thickness of the protective sheet.

13. An apparatus for determining a handling position of a semiconductor wafer to which a protective sheet is joined, the apparatus comprising:
holding means for holding the semiconductor wafer to which the protective sheet is joined;
light projecting means for projecting light of a predetermined wavelength corresponding to the protective sheet toward a face of the semiconductor wafer held by the holding means;
light intensity adjusting means for adjusting an intensity of the light on the face of the semiconductor wafer;
light receiving means, disposed opposite the light projecting means with the semiconductor wafer interposed therebetween, for receiving the light projected from the light projecting means;
moving means for moving the light projecting means and light receiving means and the holding means relatively;
determining means for determining a position of a detection site for positioning formed in the peripheral edge of the semiconductor wafer, based on a change in an amount of light received by the light receiving means during a period in which the moving means moves the light projecting means and light receiving means and the holding means relatively;
computing means for obtaining a handling position of the semiconductor wafer with the use of positional information of the detection site obtained from the result of determination by the determining means; and
rotation driving means for rotating the holding means in accordance with the result of computation by the computing means,
wherein the light intensity adjusting means is first driving means for driving the light projecting means upward/downward.

14. An apparatus for determining a handling position of a semiconductor wafer to which a protective sheet is joined, the apparatus comprising:
holding means for holding the semiconductor wafer to which the protective sheet is joined;
light projecting means for projecting light of a predetermined wavelength corresponding to the protective sheet toward a face of the semiconductor wafer held by the holding means;
light intensity adjusting means for adjusting an intensity of the light on the face of the semiconductor wafer;
light receiving means, disposed opposite the light projecting means with the semiconductor wafer interposed therebetween, for receiving the light projected from the light projecting means;
moving means for moving the light protecting means and light receiving means and the holding means relatively;
determining means for determining a position of a detection site for positioning formed in the peripheral edge of the semiconductor wafer, based on a change in an amount of light received by the light receiving means during a period in which the moving means moves the light protecting means and light receiving means and the holding means relatively;
computing means for obtaining a handling position of the semiconductor wafer with the use of positional information of the detection site obtained from the result of determination by the determining means; and
rotation driving means for rotating the holding means in accordance with the result of computation by the computing means,
wherein the light intensity adjusting means is second driving means for driving the holding means upward/downward.

* * * * *